US010921374B2

(12) United States Patent
Wada et al.

(10) Patent No.: US 10,921,374 B2
(45) Date of Patent: Feb. 16, 2021

(54) DIAGNOSIS DEVICE, ENERGY STORAGE APPARATUS, AND DIAGNOSIS METHOD

(71) Applicant: GS Yuasa International Ltd., Kyoto (JP)

(72) Inventors: Naoya Wada, Kyoto (JP); Takeyuki Shiraishi, Kyoto (JP)

(73) Assignee: GS Yuasa International Ltd., Kyoto (JP)

(*) Notice: Subject to any disclaimer, the term of this patent is extended or adjusted under 35 U.S.C. 154(b) by 166 days.

(21) Appl. No.: 15/902,763

(22) Filed: Feb. 22, 2018

(65) Prior Publication Data
US 2018/0238968 A1 Aug. 23, 2018

(30) Foreign Application Priority Data

Feb. 23, 2017 (JP) ................................ 2017-031992
Feb. 9, 2018 (JP) ................................ 2018-021861

(51) Int. Cl.
*G01R 31/327* (2006.01)
*H01H 47/00* (2006.01)
(Continued)

(52) U.S. Cl.
CPC ........ *G01R 31/3275* (2013.01); *F02N 11/087* (2013.01); *G01R 31/006* (2013.01);
(Continued)

(58) Field of Classification Search
CPC ......... G01R 31/005–008; G01R 31/327–3336; G01R 19/16528; G01R 31/00;
(Continued)

(56) References Cited

U.S. PATENT DOCUMENTS

2002/0070608 A1 6/2002 Matsuki et al.
2006/0276947 A1* 12/2006 Kaita .................. H01H 47/002
701/48
(Continued)

FOREIGN PATENT DOCUMENTS

EP 2610993 A1 7/2013
JP 2002-175750 A 6/2002
(Continued)

OTHER PUBLICATIONS

M. N. Anwar, M. Teimor and S. Swales, "Design of a Switched Reluctance Machine Converter for ISA Applications from Engine Cranking Perspectives," IEEE International Conference on Electric Machines and Drives, 2005., San Antonio, TX, 2005, pp. 219-226. (Year: 2005).*

(Continued)

*Primary Examiner* — Jeffrey C Boomer
*Assistant Examiner* — Paul Allen
(74) *Attorney, Agent, or Firm* — Alston & Bird LLP (57) ABSTRACT

A diagnosis device diagnoses current cutoff devices connected in parallel and disposed on an energization path to an energy storage device mounted on a vehicle. The diagnosis device performs switch processing of switching one of the current cutoff devices to be diagnosed from an opened state to a closed state or from the closed state to the opened state and closing the other current cutoff device while an engine of the vehicle is stopped. The diagnosis device detects end-to-end voltage of the current cutoff device when current larger than a threshold flows through the current cutoff device after the switch processing, and diagnoses the current cutoff device based on the detected end-to-end voltage.

12 Claims, 9 Drawing Sheets

(51) Int. Cl.
*G01R 31/00* (2006.01)
*F02N 11/08* (2006.01)
*H02J 7/00* (2006.01)
*G01R 19/165* (2006.01)
*H01H 1/00* (2006.01)
*H01H 9/16* (2006.01)

(52) U.S. Cl.
CPC ....... *G01R 31/007* (2013.01); *G01R 31/3278* (2013.01); *H01H 47/002* (2013.01); *H02J 7/0031* (2013.01); *F02N 2200/061* (2013.01); *F02N 2200/062* (2013.01); *G01R 19/16528* (2013.01); *H01H 9/16* (2013.01); *H01H 2001/0005* (2013.01); *H01H 2300/052* (2013.01)

(58) Field of Classification Search
CPC .............. G01R 31/3275; G01R 31/007; G01R 31/3278; G01R 31/006; F02N 11/087; F02N 2200/065; F02N 11/0862; F02N 11/10; F02N 2200/061; F02N 2200/062; H01H 47/002–005; H01H 1/0015; H01H 2001/0005; H01H 3/001; H01H 9/16; H01H 2300/052; B60R 16/00–06; H02J 7/00–36; H02J 7/0029; H02J 7/0031; H01M 2/00–1094; H01M 10/425; B60L 3/0046; B60L 3/04
USPC .......... 324/418–423; 340/644; 429/163–187; 702/58–80
See application file for complete search history.

(56) References Cited

U.S. PATENT DOCUMENTS

| | | | |
|---|---|---|---|
| 2007/0188140 A1 | 8/2007 | Chen | |
| 2009/0299561 A1* | 12/2009 | Matsumoto | B60L 3/0046 701/22 |
| 2012/0032453 A1* | 2/2012 | Nakamura | F02N 11/087 290/38 R |
| 2013/0090793 A1 | 4/2013 | Hwang et al. | |
| 2013/0320986 A1 | 12/2013 | Shiraishi et al. | |
| 2014/0232569 A1* | 8/2014 | Skinder | G08G 1/144 340/989 |
| 2015/0175103 A1* | 6/2015 | Yamazaki | F02N 11/087 701/29.1 |
| 2015/0210271 A1* | 7/2015 | Yamazaki | B60L 50/10 701/22 |
| 2015/0300308 A1* | 10/2015 | Mori | F02D 29/02 701/22 |
| 2015/0355288 A1* | 12/2015 | Yokoyama | G01R 31/392 702/63 |
| 2016/0084908 A1 | 3/2016 | Shiraishi et al. | |
| 2016/0146901 A1* | 5/2016 | Ohta | G01R 31/3278 324/538 |
| 2016/0161347 A1* | 6/2016 | Morinaga | G01K 17/08 374/1 |
| 2016/0288651 A1 | 10/2016 | Kinoshita | |
| 2018/0026312 A1* | 1/2018 | Hinterberger | H01M 2/34 429/177 |
| 2019/0128965 A1* | 5/2019 | Park | H01M 10/425 |

FOREIGN PATENT DOCUMENTS

| | | |
|---|---|---|
| JP | 4906433 B2 * | 3/2012 |
| JP | 2013-084528 A | 5/2013 |
| JP | 2013-169087 A | 8/2013 |
| JP | 2014-036556 A | 2/2014 |
| JP | 2014-232674 A | 12/2014 |
| JP | 2015-133855 A | 7/2015 |
| JP | 2016-037186 A | 3/2016 |
| JP | 2016-161478 A | 9/2016 |
| JP | 2016-193634 A | 11/2016 |

OTHER PUBLICATIONS

Shibayama—English translation of JP-4906433-B2 description via Espacenet patent translate, retrieved Jul. 30, 2020 (Year: 2020).*
European Patent Office, Extended European Search Report for Application No. 16817635.2, dated Mar. 20, 2018, 8 pages, Germany.

* cited by examiner

DIAGNOSIS DEVICE, ENERGY STORAGE APPARATUS, AND DIAGNOSIS METHOD

CROSS REFERENCE TO RELATED APPLICATIONS

This application claims priority to and the benefit of Japanese Patent Applicant No. 2017-031992, filed on Feb. 23, 2017, and Japanese Patent Application No. 2018-021861, filed on Feb. 9, 2018, the contents of both of which being hereby incorporated by reference in their entireties.

BACKGROUND

Related Field

The present invention relates to a technology of diagnosing a current cutoff device.

Description of Related Art

A battery monitoring unit (hereinafter referred to as BMU) is attached to a lithium ion secondary battery to prevent overcharge and overdischarge. The BMU prevents overcharge and overdischarge of the battery by monitoring the state of the battery and cutting off current flowing into the battery by using a current cutoff device such as a relay when having detected anomaly. When such a current cutoff device is in failure, overcharge and overdischarge of the battery cannot be prevented. Failure of the current cutoff device can be diagnosed by intentionally opening or closing the current cutoff device and measuring voltage. However, any method that requires temporary cutoff of electrical power supply cannot be performed under usage in which electrical power needs to be continuously supplied to a system in, for example, an automobile.

The following method can be used to diagnose failure of the current cutoff device while electrical power supply is continued. In this method, two current cutoff devices are connected in parallel, and change in end-to-end voltage of the current cutoff device when open and close operations of each current cutoff device are alternately repeated is detected while some amount of current flows during vehicle traveling.

Japanese Patent Laid-open No. 2014-36556 discloses a method of diagnosing failure of two current cutoff devices connected in parallel.

The above-described first method diagnoses failure of each current cutoff device by opening and closing the current cutoff device while the vehicle is traveling. Thus, when one of the current cutoff devices is opened for diagnosis while the other is in open failure due to, for example, vibration during traveling, electrical power supply is cut off while the vehicle is traveling since the two current cutoff devices are both opened. The same problem occurs to the method disclosed in Japanese Patent Laid-open No. 2014-36556.

BRIEF SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention is intended to solve the above-described problem and diagnose current cutoff devices while avoiding cutoff of electrical power supply when a vehicle is traveling.

A diagnosis device according to an aspect of the present specification diagnoses failure of current cutoff devices connected in parallel and disposed on an energization path to an energy storage device mounted on a vehicle. The diagnosis device performs switch processing of switching one of the current cutoff devices to be diagnosed from an opened state to a closed state or from the closed state to the opened state and closing the other current cutoff device while an engine of the vehicle is stopped. The diagnosis device detects end-to-end voltage of the current cutoff device when current larger than a threshold flows through the current cutoff device after the switch processing, and diagnoses the current cutoff device based on the detected end-to-end voltage.

BRIEF DESCRIPTION OF THE FIGURES

The foregoing and other features of the present invention will become apparent from the following description and drawings of an illustrative embodiment of the invention in which.

DETAILED DESCRIPTION OF VARIOUS EMBODIMENTS

The following first describes the outline of a diagnosis device disclosed in the present embodiment.

The diagnosis device diagnoses current cutoff devices connected in parallel and disposed on an energization path to an energy storage device mounted on a vehicle. The diagnosis device performs switch processing of switching one of the current cutoff devices to be diagnosed from an opened state to a closed state or from the closed state to the opened state and closing the other current cutoff device while an engine of the vehicle is stopped. The diagnosis device detects end-to-end voltage of the current cutoff device when current larger than a threshold flows through the current cutoff device after the switch processing, and diagnoses the current cutoff device based on the detected end-to-end voltage. With this configuration, switching of the current cutoff device for diagnosis is performed when the engine is stopped, i.e., the current cutoff device is not operated to perform diagnosis when the vehicle is traveling. Thus, it is possible to diagnose the current cutoff device while avoiding cutoff of electrical power supply when the vehicle is traveling. Since the end-to-end voltage of the current cutoff device is detected when current larger than the threshold flows through the current cutoff device, it is possible to accurately diagnose the current cutoff device.

The end-to-end voltage of the current cutoff device may be detected while the energy storage device is discharging. When a power unit as a load, such as a motor or a compressor, is connected, large current flows during discharging as compared to during being charged, and thus the end-to-end voltage of the diagnosis device can be measured accurately. The end-to-end voltage of the current cutoff device may be detected while the energy storage device is charged. Current is stable during being charged as compared to during discharging, and thus the end-to-end voltage of the current cutoff device can be detected at an appropriate timing. The charging may be performed by an on-board generator such as an alternator mounted on the vehicle or by an external charger provided outside of the vehicle.

The diagnosis device sequentially determines open failure and close failure of each of the pair of current cutoff devices by executing processing (1) to (3) each time when the engine stops:

(1) each time when the engine stops, one of the pair of current cutoff devices to be diagnosed is alternately switched from the opened state to the closed state or from the closed state to the opened state, while the other current cutoff device is closed;

(2) the end-to-end voltage of the current cutoff device is detected when current larger than the threshold flows after the switching; and (3) failure of the current cutoff device is determined based on the detected end-to-end voltage.

With this configuration, diagnosis is performed by alternately switching the opened and closed states of one current cutoff device as a diagnosis target in the pair of current cutoff devices connected in parallel, and the other current cutoff device is closed during the diagnosis. Thus, electrical power supply to the vehicle is unlikely to be cut off during the diagnosis.

Failure of the current cutoff device may be determined by comparing the end-to-end voltage of the current cutoff device detected when current larger than the threshold flows with a previously detected value. Change of the end-to-end voltage can be accurately determined by comparing the current detected value with the previously detected value, and thus failure of the current cutoff device can be determined accurately. Failure of the current cutoff device may be determined by comparing the end-to-end voltage of the current cutoff device detected when current larger than the threshold flows with the end-to-end voltage of the current cutoff device detected at normal operation. Failure of the current cutoff device can be determined by comparing the end-to-end voltage of the current cutoff device with the end-to-end voltage detected at normal operation.

The switch processing may be executed while the vehicle is parked. With this configuration, since the switch processing is performed during the parking, any operation noise generated due to switching is not heard by a user.

The threshold may be set based on a peak value of cranking current that flows at start of the engine. The cranking current is large current, and thus, change in the end-to-end voltage of the current cutoff device is large. Thus, the failure determination can be accurately performed.

Both of the pair of current cutoff devices connected in parallel may be closed while the vehicle is traveling after the detection of the end-to-end voltage in a case in which the current cutoff device to be diagnosed is switched from the closed state to the opened state through the switch processing while the engine is stopped. With this configuration, when one of the current cutoff devices is unintentionally opened due to, for example, vibration during traveling, electrical power supply from the energy storage device to the vehicle can be continued while the vehicle is traveling.

The current cutoff devices each may issue a warning upon determination of failure. The vehicle can be notified of failure of the failure diagnosis device by issuing a warning. The current cutoff devices each may be a relay including a mechanical contact. The relay, which includes a mechanical contact, has a conduction resistance larger than that of a semiconductor switch such as a FET. Thus, the end-to-end voltage of the relay is higher than that of the semiconductor switch when the same current flows, which leads to a higher detection accuracy of the end-to-end voltage. Thus, the failure determination can be accurately performed. When the present technology is applied, it is possible to diagnose a current cutoff device, which has a relatively high failure rate, while avoiding cutoff of electrical power supply to the vehicle. The vehicle may be an idling stop vehicle. Cranking frequently occurs to the idling stop vehicle. Thus, failure determination can be performed at a large number of timings, which leads to high reliability.

Technologies disclosed in the present specification are applicable to an energy storage apparatus including the above-described diagnosis device, and a vehicle including the energy storage apparatus. The technologies are also applicable to a diagnosis method for diagnosing a current cutoff device disposed on an energization path to an energy storage device mounted on the vehicle.

Embodiment 1

1. Description of battery

Figure 1:
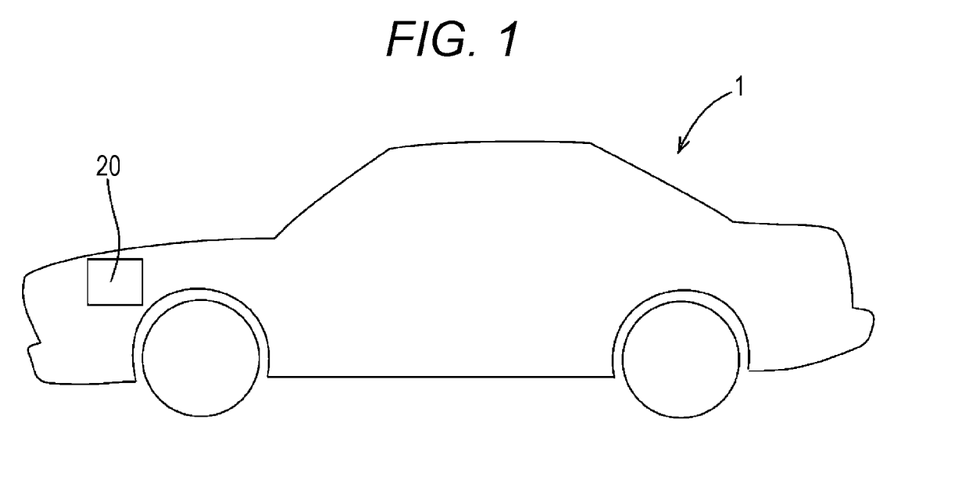
FIG. 1 is a side view of a vehicle according to Embodiment 1.
Figure 2:
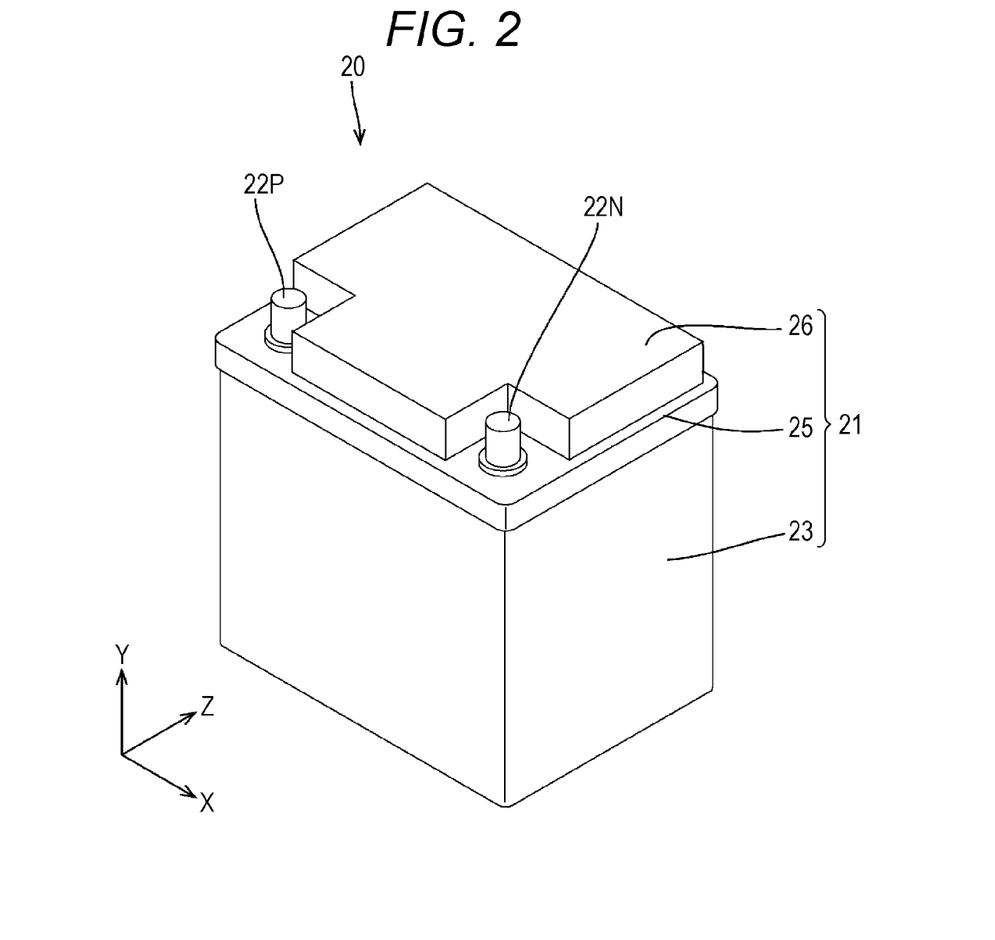
FIG. 2 is a perspective view of a battery.
Figure 3:
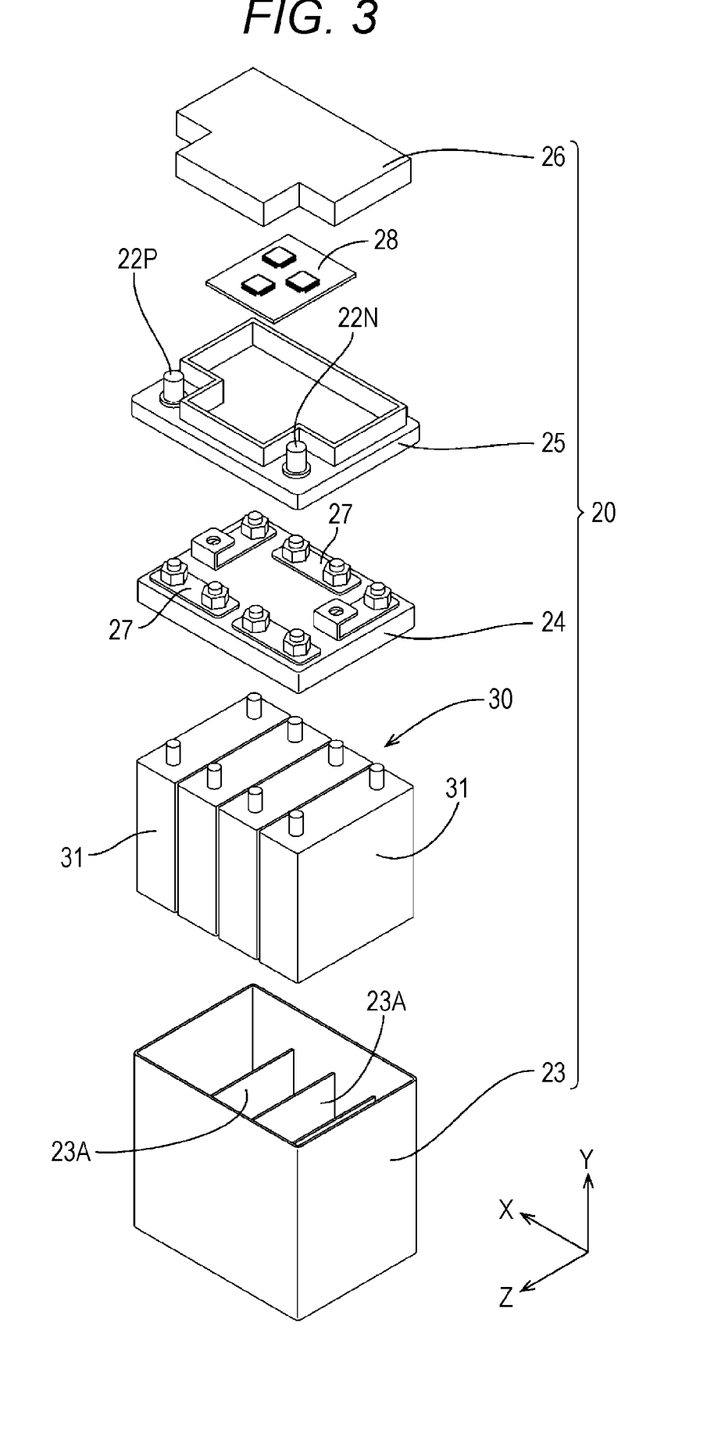
FIG. 3 is an exploded perspective view of the battery.
Figure 4:
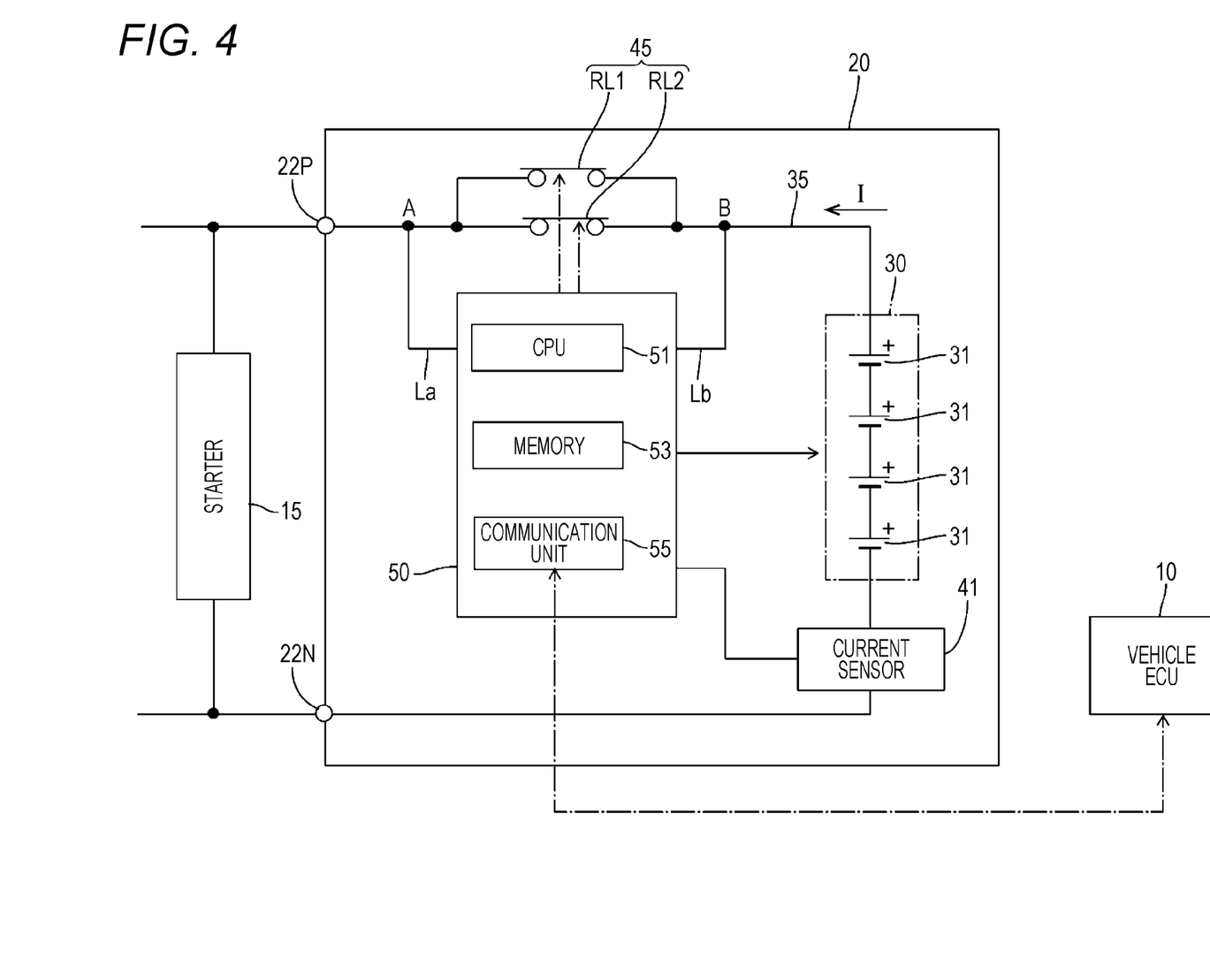
FIG. 4 is a block diagram illustrating an electric configuration of the battery.

FIG. 1 is a side view of a vehicle, FIG. 2 is a perspective view of a battery, FIG. 3 is an exploded perspective view of the battery, and FIG. 4 is a block diagram illustrating an electric configuration of the battery.

As illustrated in FIG. 1, an automobile (hereinafter, an exemplary vehicle) 1 includes a battery (energy storage apparatus) 20. As illustrated in FIG. 2, the battery 20 includes a block-shaped battery case 21 that houses an assembled battery 30 including a plurality of secondary batteries 31 and a control board 28. When FIGS. 2 and 3 are referred to in the following description, a Y direction, an X direction, and a Z direction are taken to be along the vertical direction of the battery case 21, the longitudinal direction of the battery case 21, and the depth direction of the battery case 21, respectively, when the battery case 21 is horizontally placed on an installation surface without tilt.

As illustrated in FIG. 3, the battery case 21 includes a box-shaped case body 23 having an opening which opens upward, a positioning member 24 that positions the plurality of secondary batteries 31, an inner lid 25 mounted above the case body 23, and an upper lid 26 mounted above the inner lid 25. As illustrated in FIG. 3, a plurality of cell chambers 23A in which the respective secondary batteries 31 are individually housed are provided side by side in the X direction in the case body 23.

As illustrated in FIG. 3, a plurality of bus bars 27 are disposed on an upper surface of the positioning member 24.

The plurality of secondary batteries 31 are positioned and connected with each other in series through the plurality of bus bars 27 when the positioning member 24 is disposed above the plurality of secondary batteries 31 disposed in the case body 23.

As illustrated in FIG. 2, the inner lid 25 has a substantially rectangular shape in plan view that varies in height in the Y direction. A pair of terminal parts 22P and 22N are provided at both end parts of the inner lid 25 in the X direction. The pair of terminal parts 22P and 22N are made of metal such as lead alloy. The terminal part 22P is a terminal part on a positive electrode side, and the terminal part 22N is a terminal part on a negative electrode side. The pair of terminal parts 22P and 22N are external terminals of the battery 20.

As illustrated in FIG. 3, the inner lid 25 is provided with a housing part that houses the control board 28. The control board 28 is connected with the secondary batteries 31 when the inner lid 25 is mounted on the case body 23.

The following describes the electric configuration of the battery 20 with reference to FIG. 4. The battery 20 includes the assembled battery 30, a current sensor 41, a current cutoff circuit 45, and a battery manager (hereinafter referred to as BM) 50 configured to manage the assembled battery 30. The battery manager 50 is an exemplary "failure diagnosis device" according to the present invention.

The assembled battery 30 is a 12V system and includes a plurality of energy storage devices (for example, the lithium ion secondary batteries 31) connected in series. The assembled battery 30, the current sensor 41, and the current cutoff circuit 45 are connected with each other in series through an energization path 35. The current sensor 41 is disposed on the negative electrode side, and the current cutoff circuit 45 is disposed on the positive electrode side. The current sensor 41 is connected with the negative electrode side terminal part 22N, and the current cutoff circuit 45 is connected with the positive electrode side terminal part 22P.

As illustrated in FIG. 4, the terminal parts 22P and 22N of the battery 20 are connected with a starter 15 configured to start an engine mounted on the vehicle 1. The starter 15 is driven by receiving electrical power supply from the battery 20. The battery 20 is also connected with a vehicle load (not illustrated) such as an electric component, and an alternator (not illustrated) in addition to the starter 15. When the amount of power generated by the alternator is larger than power consumption at the vehicle load, the battery 20 is charged with electricity by the alternator. When the amount of power generated by the alternator is smaller than power consumption at the vehicle load, the battery 20 discharges electricity to supplement this shortage.

The current sensor 41 is provided inside the battery case 21 to detect current I flowing into the secondary batteries 31. The current sensor 41 is electrically connected with the BM 50 through a signal line so that output from the current sensor 41 is input to the BM 50.

The current cutoff circuit 45 is provided inside the battery case 21. The current cutoff circuit 45 is disposed on the energization path 35 of the assembled battery 30, and includes a pair of relays RL1 and RL2 connected with each other in parallel. The configuration in which the two relays RL1 and RL2 are provided in parallel provides redundancy such that electrical power supply to the vehicle is maintained when one of the relays RL1 and RL2 is in failure. The relays RL1 and RL2 are exemplary current cutoff devices.

The relays RL1 and RL2 are each, for example, a latch-type relay configured to mechanically open a contact point by electromagnetic action upon reception of an open command from the BM 50. Upon reception of a close command, the relay mechanically closes the contact point by electromagnetic action.

The BM 50 can individually control opening and closing of the relays RL1 and RL2 by individually transmitting the open and close commands to the relays RL1 and RL2. The assembled battery 30 is energized when at least one of the two relays RL1 and RL2 is closed. The energization to the assembled battery 30 is cut off when the two relays RL1 and RL2 are both opened. Reference sign RL is used in the following description when the two relays are not particularly distinguished from each other.

The BM 50 includes a CPU 51 having a calculation function, a memory 53 storing various kinds of information, and a communication unit 55, and is provided to a control board 28. The communication unit 55 is connected with a vehicle electronic control unit (ECU) 10 mounted on the vehicle so that the BM 50 can receive information related to the vehicle such as the operation state of the engine from the vehicle ECU 10.

The BM 50 monitors the current of the secondary batteries 31 based on output from the current sensor 41. The BM 50 also monitors the voltages of the secondary batteries 31 and the total voltage of the assembled battery 30 based on output from a voltage detection circuit (not illustrated). The BM 50 also monitors the temperature of the secondary batteries 31 based on output from a temperature sensor (not illustrated).

The BM 50 monitors voltage, current, and anomaly of the secondary batteries 31. When having detected anomaly, the BM 50 opens the two relays RL1 and RL2 to prevent the secondary batteries 31 from becoming into an unhealthy state.

The BM 50 is connected with both ends, an end point A and an end point B of each of the relays RL1 and RL2 through voltage measurement lines La and Lb to detect end-to-end voltage (voltage between the two points A and B) Vab of the relays RL1 and RL2.

2. Failure Diagnosis of Relays RL1 and RL2

The CPU 51 of the BM 50 switches the relay RL from an opened state to a closed state or from the closed state to the opened state while the vehicle is parked, and thereafter detects the end-to-end voltage Vab of the relay RL when the engine starts. Then, the CPU 51 diagnoses open failure and close failure of the relay RL based on the detected end-to-end voltage Vab. The open failure refers to failure in which the relay RL does not close upon reception of the close command but is fixed to the opened state. The close failure refers to failure in which the relay RL does not open upon reception of the open command but is fixed to the closed state.

The following specifically describes processing of diagnosing failure of the relay RL with reference to FIGS. 5 and 6A-6D. The failure diagnosis processing illustrated in FIG. 5 includes steps S10 to S50 and is executed by the CPU 51, for example, simultaneously when the BM 50 is activated to start monitoring of the assembled battery 30.

Figure 5:
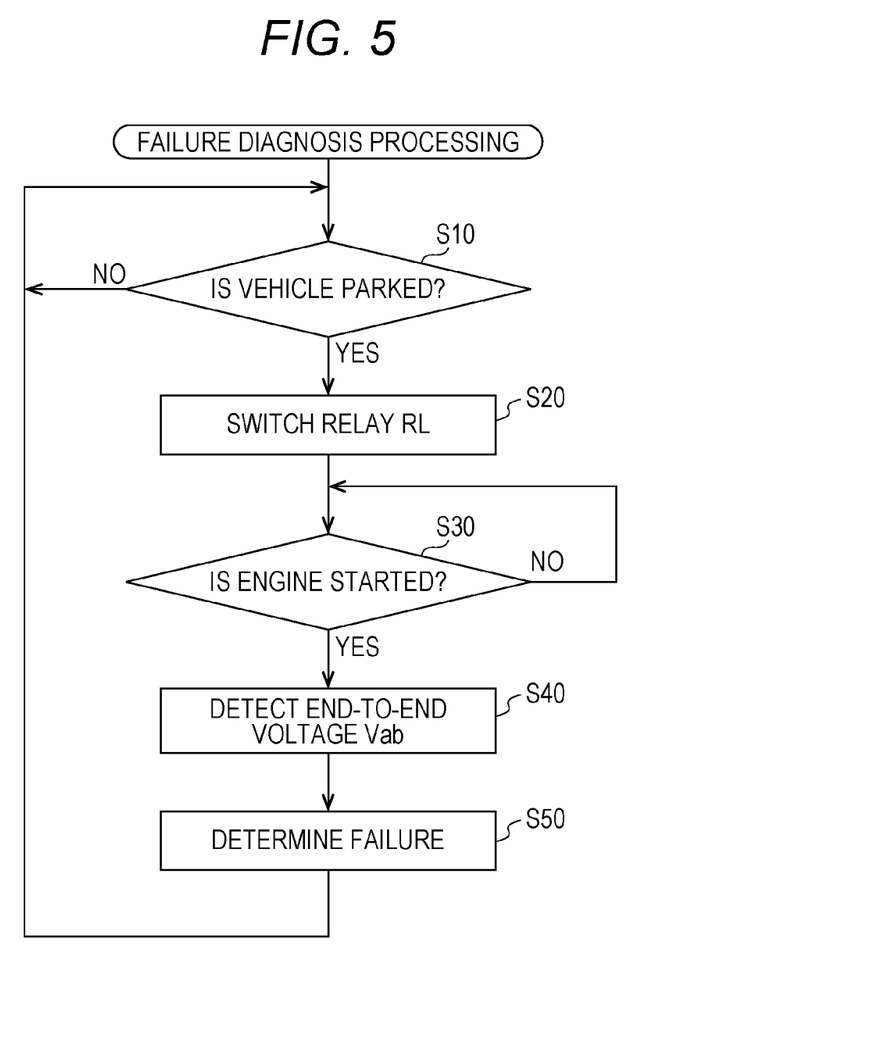
FIG. 5 is a flowchart illustrating the process of diagnosis processing.

The relays RL1 and RL2 are both closed before the failure diagnosis processing. Failure of the relay RL1 is diagnosed at the first and second failure diagnosis processing, and failure of the relay RL2 is diagnosed at the third and fourth failure diagnosis processing.

First Processing (Diagnosis of Failure of Relay RL1)

When the processing starts, the BM 50 executes processing of detecting parking of the vehicle (S10). Parking refers to a state in which at least a drive unit such as an engine or a motor is stopped and no motion of the vehicle occurs for a predetermined time. Parking of the vehicle can be determined based on whether a state in which a current value detected by the current sensor 41 is equal to or smaller than a predetermined value continues for the predetermined time or longer. The predetermined value is set in accordance with the magnitude of dark current (minute current) flowing from the battery 20 only to a particular load of the vehicle during parking, and is, for example, 100 mA approximately. Alternatively, the determination can be made based on, for example, whether communication with the vehicle ECU 10 is stopped for a predetermined time or longer.

When having detected parking of the vehicle (parking for the first time), the BM 50 performs processing of switching the opened and closed states of the relay RL1 as a diagnosis target among the two relays RL1 and RL2 (S20).

Figure 6A:
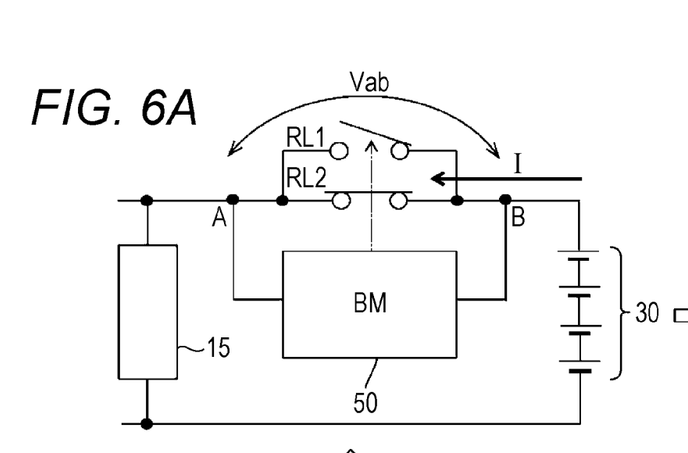
FIGS. 6A-D are a set of diagrams illustrating exemplary state transition of relays in the diagnosis processing.

In processing at S20 executed in the first processing, the open command is transmitted from the BM 50 to the relay RL1. Accordingly, as illustrated in FIG. 6A, the relay RL1 normally switches from the closed state to the opened state. No command is transmitted from the BM 50 to the relay RL2, and the relay RL2 remains in the closed state.

After having performed the switching of the relay RL1, the BM 50 then executes processing of detecting start of the engine (S30). Start of the engine can be detected based on whether the current value detected by the current sensor 41 is larger than a threshold. The threshold is set in accordance with the magnitude of a peak value Ip of cranking current that flows from the battery 20 to the starter 15 at cranking of the engine, and is, for example, 800 A approximately.

Figure 7:
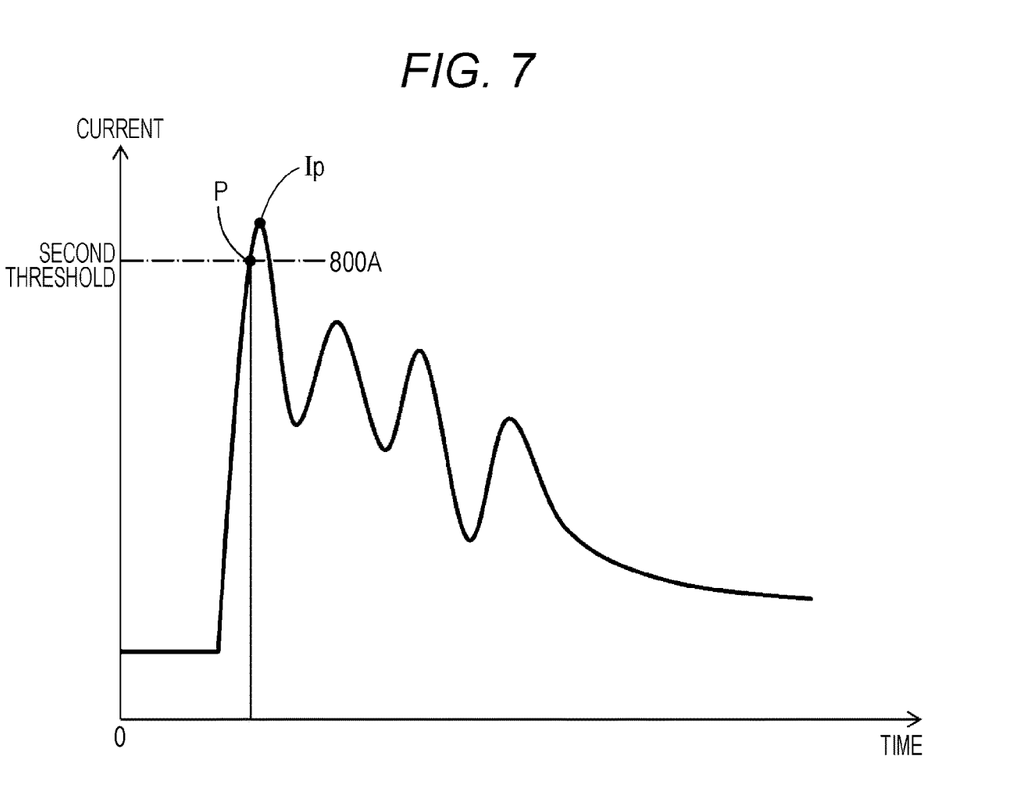
FIG. 7 is a graph illustrating the waveform of cranking current at engine start.

The processing at S30 is repeated in a wait state until start of the engine is detected. When having detected start of the engine, the BM 50 detects the end-to-end voltage Vab of the pair of relays RL1 and RL2 (S40). Specifically, as illustrated in FIG. 7, the end-to-end voltage Vab is detected at a timing P at which the current value detected by the current sensor 41 exceeds the threshold (in the present example, 800 A), in other words, a timing at which the cranking current is near the peak value.

A resistance value between the two points A and B when the relay RL1 is normally opened is 200µΩ for a conduction resistance value (resistance value in the closed state) of 200µΩ for each relay. Thus, the end-to-end voltage Vab detected when the relay RL1 is normally opened is 160 mV.

When having detected the end-to-end voltage Vab, the BM 50 then executes processing of determining failure of the relay RL1 by calculating a voltage difference through comparison of the detected end-to-end voltage Vab with a previous value at S40. No previous value is available at the first determination, and thus the determination of failure of the relay RL1 is not performed, but processing of storing the end-to-end voltage Vab detected at S40 in the memory 53 is performed. This ends the first failure diagnosis processing (S10 to S50).

Second Processing (Diagnosis of Failure of Relay RL1)

Thereafter, the second processing is started, and the BM 50 executes processing of detecting parking of the vehicle (S10). The processing at S10 (NO at S10) is repeated in a wait state while the vehicle is traveling after start of the engine.

When the vehicle has transitioned from traveling to parking (parking for the second time), the BM 50 detects the parking of the vehicle performs processing of switching the opened and closed states of the relay RL1 (S20).

Figure 6B:
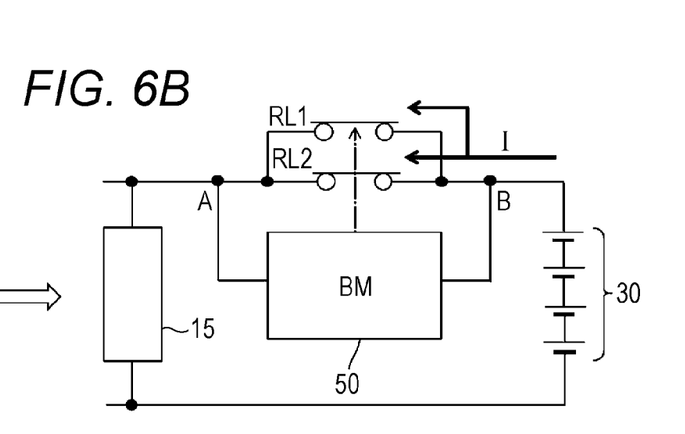

In the processing at S20 executed for the second time, the close command is transmitted from the BM 50 to the relay RL1. Accordingly, as illustrated in FIG. 6B, the relay RL1 normally switches from the opened state to the closed state. No command is transmitted from the BM 50 to the relay RL2, and the relay RL2 remains in the closed state.

When having transmitted a switching command to the relay RL1, the BM 50 then executes processing of detecting start of the engine (S30). The processing at S30 is repeated in a wait state until start of the engine is detected.

When having detected start of the engine, the BM 50 detects the end-to-end voltage Vab of the pair of relays RL1 and RL2 (S40). The resistance value between the two points A and B when the relay RL1 normally operates in the closed state is 100 µΩ for a conduction resistance value of 200 µΩ for each relay. Thus, the end-to-end voltage Vab detected at start of the engine is 80 mV when the relay RL1 is normally closed.

When having detected the end-to-end voltage Vab, the BM 50 then executes processing of determining failure of the relay RL1 based on the end-to-end voltage Vab detected at S40. Specifically, when the relay RL1 normally operates in the closed state, the end-to-end voltage Vab detected for the second time is 80 mV, which is different from the end-to-end voltage Vab detected for the first time by a voltage difference of 80 mV approximately.

Thus, when the comparison between the end-to-end voltage Vab detected at S40 and the previous value has found that the absolute value of the voltage difference between the two end-to-end voltages Vab is equal to or larger than the defined value (for example, 40 mV), it can be determined that no open failure has occurred to the relay RL1.

When it is determined that no open failure has occurred, processing of storing the end-to-end voltage Vab detected at S40 in the memory 53 is performed. This ends the second failure diagnosis processing (S10 to S50). Thereafter, the third failure diagnosis processing is executed.

In the second failure diagnosis processing, it is determined that open failure has occurred to the relay RL1 when the absolute value of the voltage difference between the two end-to-end voltages Vab is smaller than the defined value (for example, 40 mV). When it is determined that open failure has occurred, warning processing such as anomaly notification from the BM 50 to the vehicle ECU 10 is executed.

Third Processing (Diagnosis of Failure of Relay RL2)

Thereafter, the third processing is started, and the BM 50 executes the processing of detecting parking of the vehicle (S10). When the vehicle has transitioned from traveling to parking (parking for the third time), the BM 50 detects the parking of the vehicle and performs processing of switching the opened and closed states on the relay RL2 (S20).

Figure 6C:
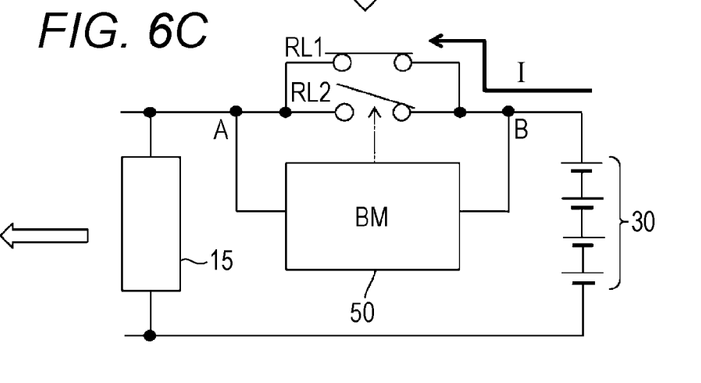

In the processing at S20 executed for the third time, the open command is transmitted from the BM 50 to the relay RL2. Accordingly, as illustrated in FIG. 6C, the relay RL2 normally switches from the closed state to the opened state.

No command is transmitted from the BM 50 to the relay RL1, and the relay RL1 remains in the closed state.

When having transmitted a switching command to the relay RL2, the BM 50 then executes processing of detecting start of the engine (S30). The processing at S30 is repeated in a wait state until start of the engine is detected.

When having detected start of the engine, the BM 50 detects the end-to-end voltage Vab of the pair of relays RL1 and RL2 (S40). The resistance value between the two points A and B is 200 µΩ when the relay RL2 normally operates in the opened state. Thus, the end-to-end voltage Vab detected at start of the engine 160 mV when the relay RL2 normally operates in the opened state.

When having detected the end-to-end voltage Vab, the BM 50 then executes processing of determining failure of the relay RL2 based on the end-to-end voltage Vab detected at S40. Specifically, when the relay RL2 normally operates in the opened state, the end-to-end voltage Vab detected for the third time is 160 mV, which is different from the end-to-end voltage Vab detected for the second time by a voltage difference of 80 mV approximately.

Thus, when the comparison between the end-to-end voltage Vab detected at S40 and the previous value has found that the absolute value of the voltage difference between the two end-to-end voltages Vab is equal to or larger than the defined value (for example, 40 mV), it can be determined that no close failure has occurred to the relay RL2.

When it is determined that no close failure has occurred, processing of storing the end-to-end voltage Vab detected at S40 in the memory 53 is performed. This ends the third failure diagnosis processing (S10 to S50). Thereafter, the fourth failure diagnosis processing is executed.

In the third failure diagnosis processing, it is determined that the close failure has occurred to the relay RL2 when the absolute value of the voltage difference between the two end-to-end voltages Vab is smaller than the defined value (for example, 40 mV). When it is determined that close failure has occurred, warning processing such as anomaly notification from the BM 50 to the vehicle ECU 10 is executed.

Fourth Processing (Diagnosis of Failure of Relay RL2)

Thereafter, the fourth processing is started, and the BM 50 executes processing of detecting parking of the vehicle (S10). When the vehicle has transitioned from traveling to parking (parking for the fourth time), the BM 50 detects the parking of the vehicle and performs processing of switching the opened and closed states on the relay RL2 (S20).

Figure 6D:
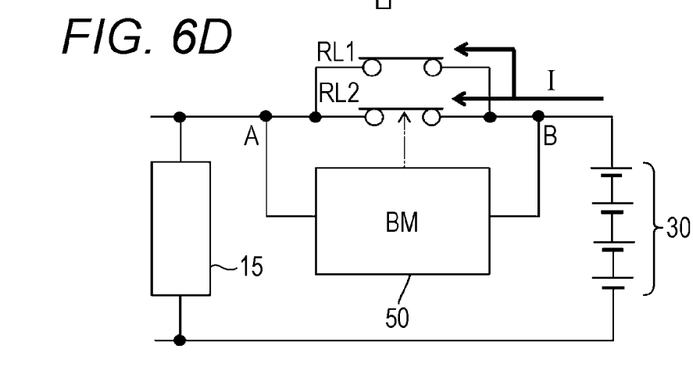

In the processing at S20 executed for the fourth time, the close command is transmitted from the BM 50 to the relay RL2. Accordingly, as illustrated in FIG. 6D, the relay RL2 normally switches from the opened state to the closed state. No command is transmitted from the BM 50 to the relay RL1, and the relay RL1 remains in the closed state.

When having transmitted a switching command to the relay RL2, the BM 50 then executes processing of detecting start of the engine (S30). The processing at S30 is repeated in a wait state until start of the engine is detected.

When having detected start of the engine, the BM 50 detects the end-to-end voltage Vab of the pair of relays RL1 and RL2 (S40). The resistance value between the two points A and B is 100 µΩ when the relay RL2 normally operates in the closed state. Thus, the end-to-end voltage Vab detected at start of the engine is 80 mV when the relay RL2 normally operates in the closed state.

When having detected the end-to-end voltage Vab, the BM 50 then executes processing of determining failure of the relay RL2 based on the end-to-end voltage Vab detected at S40. Specifically, when the relay RL2 normally operates, the end-to-end voltage Vab detected for the fourth time is 80 mV, which is different from the end-to-end voltage Vab detected for the third time by a voltage difference of 80 mV approximately.

Thus, when the comparison between the end-to-end voltage Vab detected at S40 and the previous value has found that the absolute value of the voltage difference between the two end-to-end voltages Vab is equal to or larger than the defined value (for example, 40 mV), it can be determined that no open failure has occurred to the relay RL2. When it is determined that no open failure has occurred, processing of storing the end-to-end voltage Vab detected at S40 in the memory 53 is performed. This ends the fourth failure diagnosis processing (S10 to S50).

In the fourth failure diagnosis processing, it is determined that open failure has occurred to the relay RL2 when the absolute value of the voltage difference between the two end-to-end voltages Vab is smaller than the defined value (for example, 40 mV). When it is determined that open failure has occurred, warning processing such as anomaly notification from the BM 50 to the vehicle ECU 10 is executed.

The failure diagnosis processing includes the first to fourth processing in a cycle. When the first cycle ends, the second cycle starts at execution of the first failure diagnosis processing, similarly to the first cycle.

Accordingly, in the first failure diagnosis processing, the BM detects the end-to-end voltage Vab of the pair of relays RL1 and RL2 at start of the engine after transmitting a command for switching to the opened state to the relay RL1 during parking.

The BM 50 determines whether close failure has occurred to the relay RL1 by calculating a voltage difference through comparison of the detected end-to-end voltage Vab with the previous value (the end-to-end voltage Vab detected in the fourth failure diagnosis processing of the first cycle) and comparing the absolute value of the calculated voltage difference with the defined value.

When it is determined that no close failure has occurred, processing of storing the end-to-end voltage Vab detected at S40 in the memory 53 is performed. When it is determined that close failure has occurred, warning processing such as anomaly notification from the BM 50 to the vehicle ECU 10 is executed.

The second failure diagnosis processing or later is same as the corresponding failure diagnosis processing of the first cycle. In the second failure diagnosis processing, it is determined whether open failure has occurred to the relay RL1. In the third failure diagnosis processing, it is determined whether close failure has occurred to the relay RL2. In the fourth failure diagnosis processing, it is determined whether open failure has occurred to the relay RL2.

As described above, the BM 50 sequentially diagnoses open failure and close failure for each of the pair of relays RL1 and RL2 at each parking of the vehicle by executing the following (1) to (3).

(1) Detect parking of the vehicle and alternately switch the relay RL as a diagnosis target among the pair of relays RL1 and RL2 from the opened state to the closed state or from the closed state to the opened state while the other relay is closed (S20).

(2) Detect the end-to-end voltage Vab of the relays RL1 and RL2 when the engine starts after the switching (S40).

(3) Determine failure of the relay RL as a diagnosis target based on the detected end-to-end voltage Vab (S50).

3. Description of Effects

In the present configuration, since the switching of the relays RL1 and RL2 for failure diagnosis is performed during parking, the relays RL1 and RL2 are not operated for failure diagnosis when the vehicle is traveling. Thus, it is possible to diagnose failure of the relays RL1 and RL2 while avoiding cutoff of electrical power supply when a vehicle is traveling. Thus, the requirements of functional safety (ISO Standard 26262) for an automobile are satisfied.

The end-to-end voltage Vab of the relays RL1 and RL2 is detected when the cranking current flows at start of the engine. Since the cranking current is large current, change in the end-to-end voltage Vab is large. Thus, the determination of failure of the relays RL1 and RL2 can be accurately performed.

In the present configuration, since failure diagnosis is performed by alternately switching the opened state and the closed state of each of the pair of relays RL1 and RL2, one of the relays RL1 and RL2 remains in the closed state during the failure diagnosis. Thus, electrical power supply to the vehicle is unlikely to be cut off during the failure diagnosis.

Embodiment 2

In Embodiment 1, the BM 50 switches each of the relays RL1 and RL2 as a diagnosis target from the closed state to the opened state to diagnose close failure of the relays RL1 and RL2 during parking. For example, FIG. 6A illustrates that the relay RL1 is switched from the closed state to the opened state upon detection of parking to diagnose close failure of the relay RL1, and FIG. 6C illustrates that the relay RL2 is switched from the closed state to the opened state upon detection of parking to diagnose close failure of the relay RL2.

Then, the end-to-end voltage Vab of the relays RL1 and RL2 is detected when the engine starts after the switching of the relays RL1 and RL2 and compared with the previous value to diagnose open failure of the relays RL1 and RL2.

In the Embodiment 2, when the vehicle is traveling after the detection of the end-to-end voltage, the BM 50 closes both of the pair of relays RL1 and RL2 connected with each other in parallel. Specifically, when the vehicle has transitioned to a traveling state after the relay RL1 is switched to the opened state as illustrated in FIG. 6A and close failure of the relay RL1 is diagnosed, the BM 50 transmits the close command to the relay RL1. Accordingly, the relay RH switches from the opened state to the closed state, and the two relays RL1 and RL2 are both closed during traveling.

When the vehicle has transitioned to a traveling state after the relay RL2 is switched to the opened state as illustrated in FIG. 6C and close failure of the relay RL2 is diagnosed, the BM 50 transmits the close command to the relay RL2. Accordingly, the relay RL2 switches from the opened state to the closed state, and the two relays RL1 and RL2 are both closed during traveling.

The vehicle ECU 10 monitors the state of the engine. Thus, the BM 50 can determine whether the vehicle is traveling by receiving information related to the state of the engine from the vehicle ECU 10 through communication.

In Embodiment 2, since the two relays RL1 and RL2 are both closed during traveling, electrical power supply from the battery 20 to the vehicle while the vehicle is traveling can be continued when the relay RL as one of the pair of relays RL1 and RL2 is unintentionally opened due to, for example, vibration during traveling. Thus, the requirements of functional safety (ISO Standard 26262) for an automobile are satisfied. In Embodiment 2, both of the two relays RL1 and RL2 are closed during traveling. Thus, as illustrated in FIGS. 6B and 6D, open failure of the relay RL1 or the relay RL2 can diagnosed by detecting, without operation to close the relay RE while the vehicle is parked, the end-to-end voltage Vab of the relay RL at start of the engine and comparing the detected voltage with the previous value.

Other Embodiments

The present invention is not limited to the embodiments explained with the above-described description and drawings. For example, embodiments described below are also included in the technical scope of the present invention.

(1) In Embodiments 1 and 2, the relay RL is described as an exemplary current cutoff device, but a semiconductor switch such as a FET or a transistor may be used. Although a lithium ion secondary battery is described as an exemplary energy storage device, the energy storage device may be any other secondary battery or capacitor. The number of energy storage devices does not need to be plural, but may be one.

(2) Embodiments 1 and 2 describe above the example in which switch processing of switching the relay RL as a diagnosis target from the opened state to the closed state or from the closed state to the opened state is performed during parking. However, the switch processing does not necessarily need to be executed during parking, but may be performed any time while the engine is stopped. For example, the switch processing may be performed right after engine stop.

(3) Embodiments exemplarily describe above the method of switching the relay RL upon detection of parking of the vehicle and thereafter determining failure of the relay RL through comparison of a detected end-to-end voltage Vab of the relay RL with a previous value when the engine starts. The determination of failure of the relay RL may be performed by, in place of the method exemplarily described in the embodiments, for example, comparing the end-to-end voltage Vab of the relay RL detected when the engine starts time with the end-to-end voltage Vab of the normally operating relay (end-to-end voltage detected at start of the engine when the relay RL normally operates). For example, when the relay RL1 is switched to the closed state as illustrated in FIG. 6B to diagnose open failure of the relay RL1, the end-to-end voltage Vab of the relay RL detected at start of the engine is 80 mV as long as no open failure has occurred to the relay RL1. Thus, the failure determination may be performed based on whether an actually detected end-to-end voltage Vab is 80 mV.

(4) Embodiments exemplarily describe above the method of switching the relay RL upon detection of parking of the vehicle and thereafter determining failure of the relay RL through comparison of a detected end-to-end voltage Vab of the relay RL with a previous value when the engine starts. However, the end-to-end voltage Vab of the relay RL may be detected when the engine starts after idling stop. Specifically, when the engine starts a plurality of times until the vehicle is parked next time after the relay RL is switched upon detection of parking, the end-to-end voltage Vab of the relay RL may be detected at any timing. The idling stop refers to a system in which the engine is automatically stopped when the vehicle is stopped at, for example, a traffic light, and then the engine is started again when the vehicle starts moving.

(5) In Embodiments 1 and 2, the relay RL is switched from the opened state to the closed state or from the closed state to the opened state while the vehicle is parked. Thereafter, the end-to-end voltage Vab of the relay RL is detected when current of 800 A or larger flows through the relay RL, and open failure and close failure of the relay RL are diagnosed based on the detected end-to-end voltage Vab. The current threshold on which whether to detect the end-to-end voltage Vab is determined is not limited to 800 A. For example, each relay RL has a conduction resistance of 800 μΩ and a lowest voltage measurable by the BM 50 is 80 mV. In this case, when current of 200 A or larger flows while the two relays RL1 and RL2 are closed, the end-to-end voltage Vab is 80 mV, which is equal to the lowest voltage measurable by the BM 50. Thus, the threshold may be set to be 200 A so that the end-to-end voltage Vab of the relay RL can be detected when current of 200 A or larger flows. For example, each relay RL has a conduction resistance of 800 μΩ and a lowest voltage measurable by the BM 50 is 40 mV. In this case, when current of 100 A or larger flows while the two relays RL1 and RL2 are closed, the end-to-end voltage Vab is 40 mV, which is equal to the lowest voltage measurable by the BM 50. Thus, the threshold may be set to be 100 A so that the end-to-end voltage Vab of the relay RL can be detected when current of 100 A or larger flows. As described above, the threshold can be determined based on whether the end-to-end voltage Vab of the relay RL is measurable by the BM 50.

Figure 8:
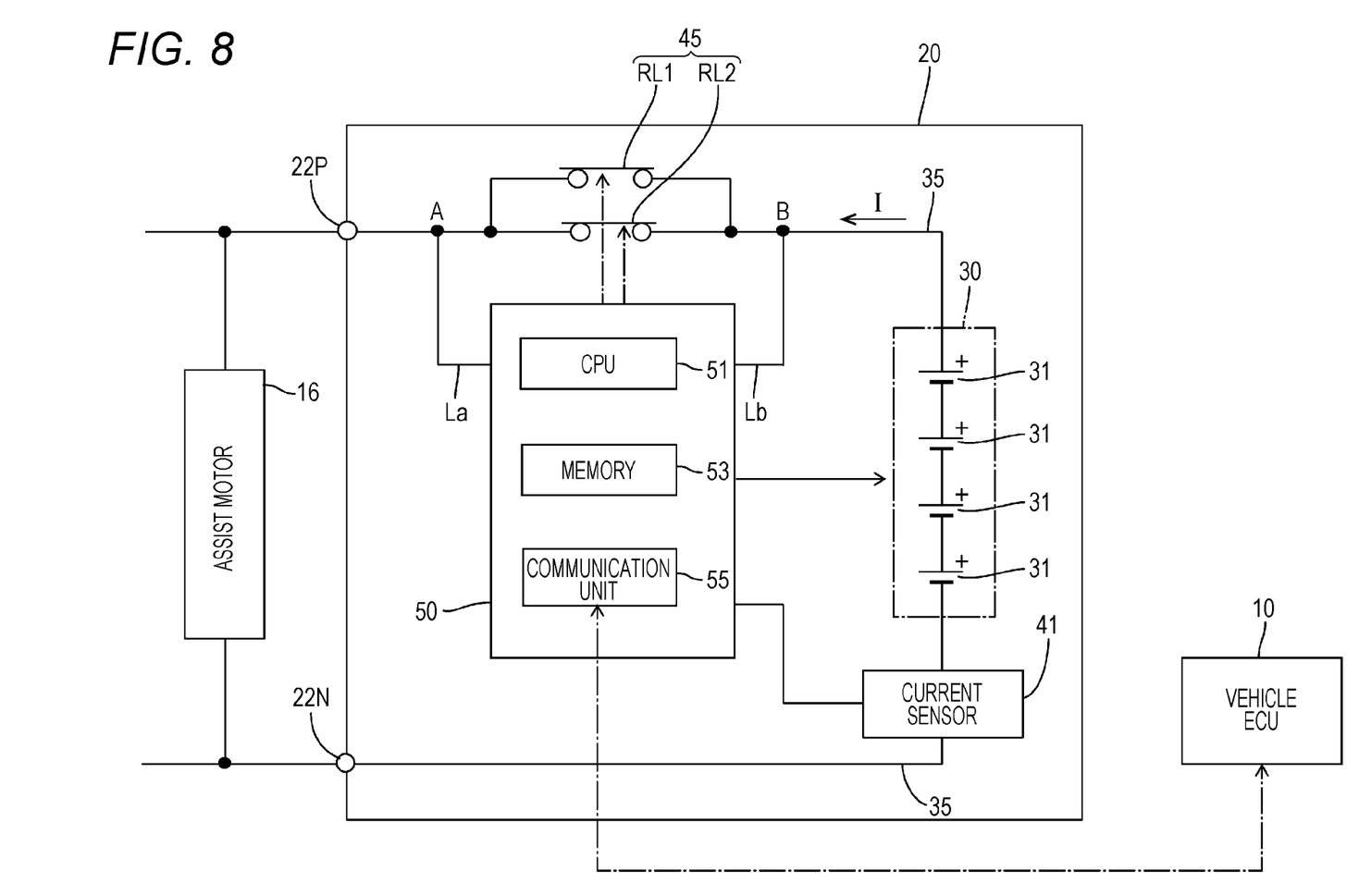
FIG. 8 is a block diagram illustrating an electric configuration of the battery connected with an assist motor.

The end-to-end voltage Vab of the relay RL may be detected at any timing other than start of the engine, such as when the vehicle 1 starts traveling or during traveling, while current larger than the threshold is flowing through the relay RL. As illustrated in FIG. 8, when the battery 20 is connected with an assist motor 16 configured to assist traveling of the vehicle 1, the end-to-end voltage Vab of the relay RL may be detected while current larger than the threshold is flowing from the battery 20 to the assist motor 16. A current value compared with the threshold is a total current flowing through the two relays RL1 and RL2. When one of the two relays RL1 and RL2 is closed, the current value is current flowing through the closed relay. When both of the two relays RL1 and RL2 are closed, the current value is the total current flowing through the two closed relays RL1 and RL2.

(6) The end-to-end voltage Vab may be detected at any timing while current larger than the threshold is flowing through the relay RL, namely, at any of discharging and charging. When the battery 20 is connected with a power unit as a load, such as a motor or a compressor, the end-to-end voltage Vab of the relay RL is high, and thus measurement accuracy is high, because large current flows during discharging as compared to during charging. Thus, when measurement accuracy is prioritized, the end-to-end voltage Vab is preferably detected while the battery 20 is discharging. Current is likely to be stable during charging as compared to during discharging, and thus the end-to-end voltage Vab of the relay RL can be detected at an easier timing. Thus, when detection timing is prioritized, the end-to-end voltage Vab is preferably detected while the battery 20 is being charged. The charging may be performed by an on-board generator such as an alternator mounted on the vehicle or by an external charger provided outside of the vehicle. Whether the battery 20 is discharging or being charged can be determined by the CPU 51 based on the polarity of current detected by the current sensor 41.

Figure 9:
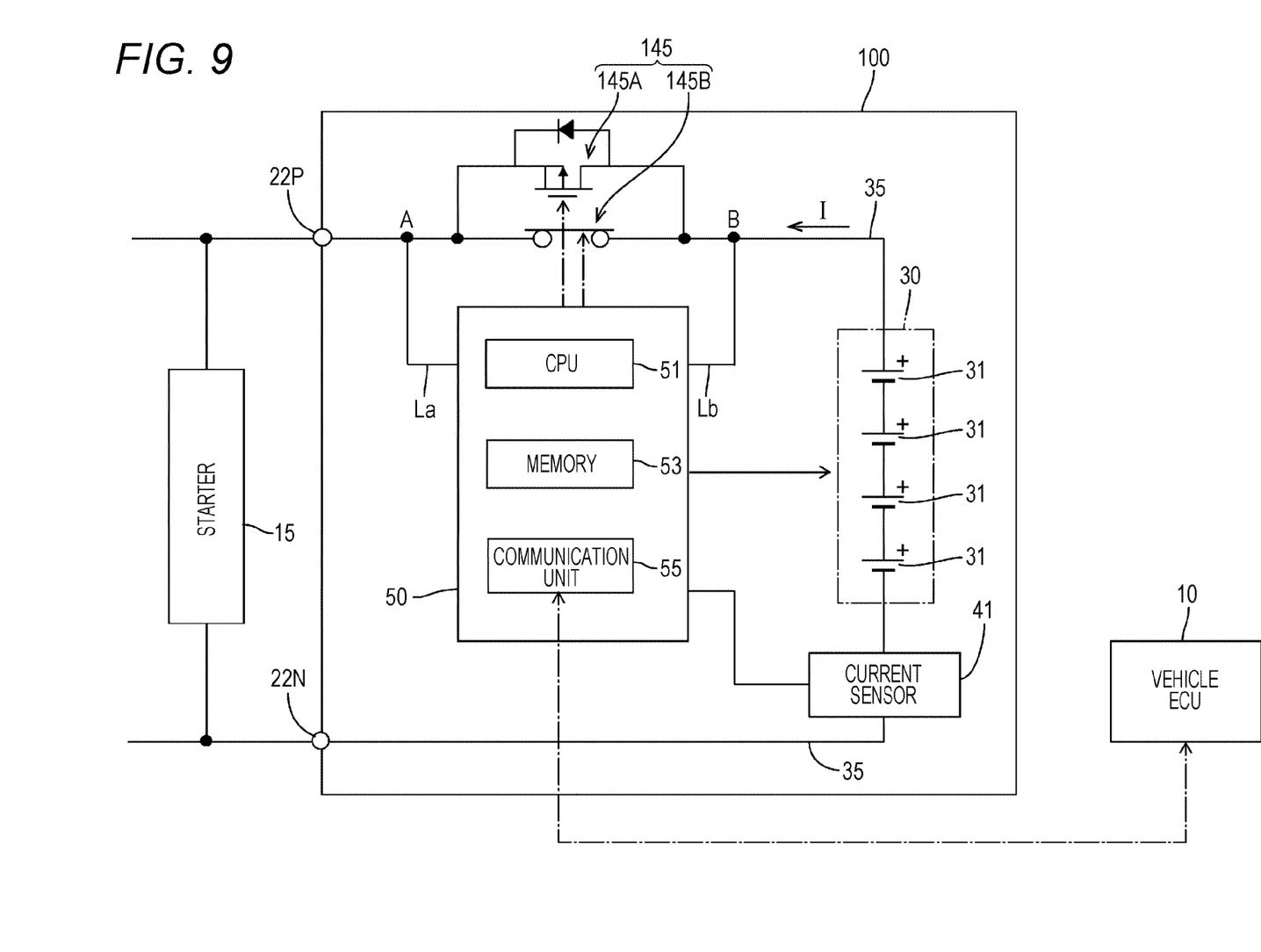
FIG. 9 is a block diagram illustrating an electric configuration of the battery according to another embodiment.

(7) In Embodiments 1 and 2, the current cutoff circuit 45 includes the two relays RL1 and RL2 connected in parallel. As in a battery 100 illustrated in FIG. 9, a current cutoff circuit 145 may include a semiconductor switch 145A and a relay 145B combined in parallel. When the semiconductor switch 145A has a current capacity smaller than that of the relay 145B, a plurality of the semiconductor switches 145A can be connected in parallel to supplement shortage of the current capacity.

Figure 10:
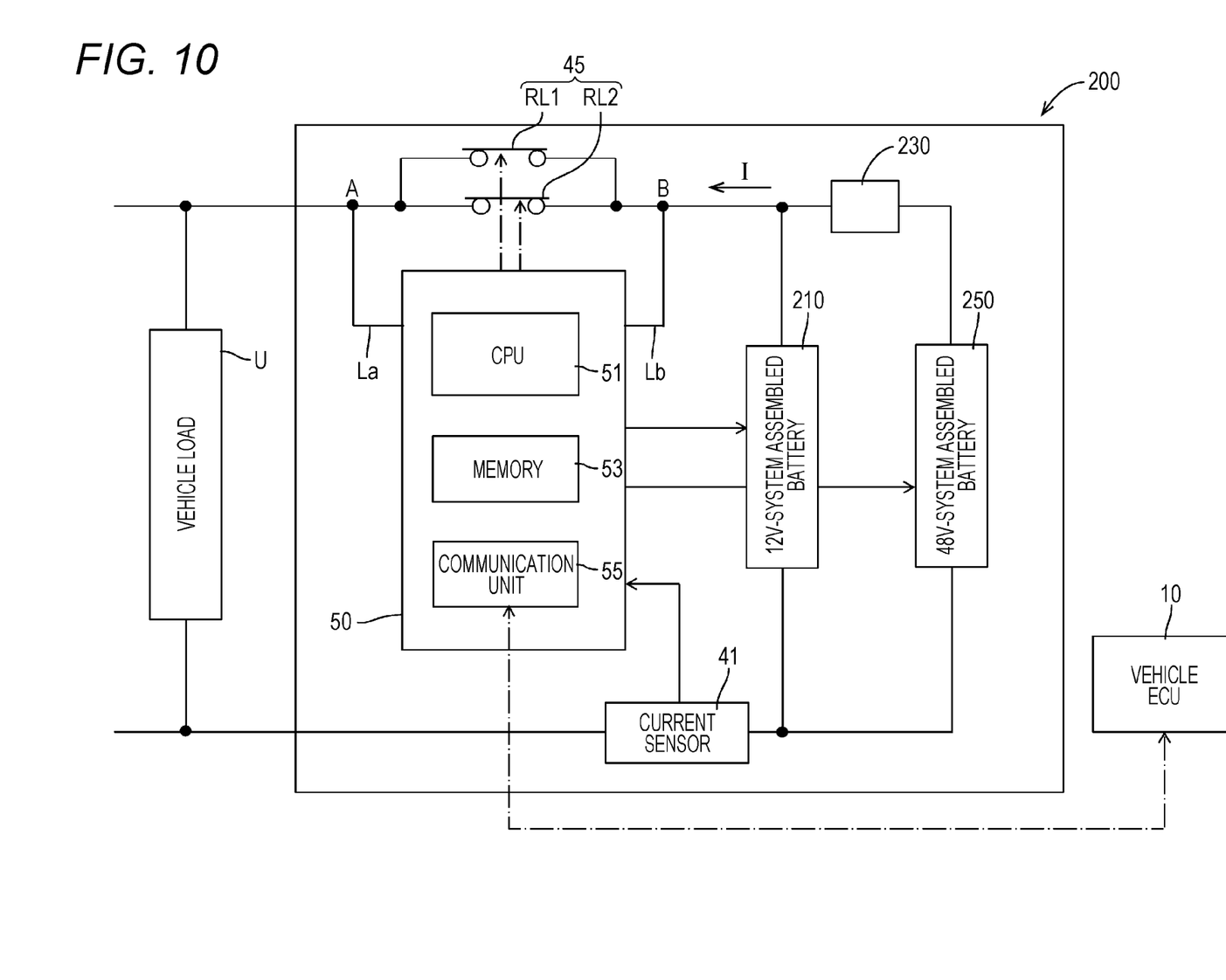
FIG. 10 is a block diagram illustrating a power system including a combination of a 12V-system assembled battery and a 48V-system assembled battery.

(8) Embodiments 1 and 2 exemplarily describe a power system in which electrical power is supplied from the assembled battery 30 of a 12V system to the starter 15. The present technology is applicable to a power system 200 in which a 12V-system assembled battery 210 is combined with a 48V-system assembled battery 250 through a DC-DC converter 230 as illustrated in FIG. 10 and that supplies electrical power to a 12V-system vehicle load U such as a starter or an assist motor. The present technology is also applicable to a power system in which a 12V-system assembled battery and a 24V-system assembled battery are combined.

(9) The technology disclosed in the present specification is applicable to any usage in which current larger than a threshold flows through a current cutoff device. The battery 20 or 100 or the power system 200 may be mounted on, in addition to an automobile as described above, for example, a hybrid electric vehicle (HEV) that also operates by electric drive, a motorcycle, and a railway vehicle that generates large regeneration electrical power. When the present technology is performed on the battery 20 or 100 or the power system 200 mounted on an idling-stop vehicle, failure sensing can be performed at a large number of timings due to cranking that frequently occurs to the idling-stop vehicle, which leads to high reliability of failure detection.

The invention claimed is:

1. A diagnosis device that diagnoses current cutoff devices connected in parallel and disposed on an energization path to an energy storage device mounted on a vehicle, the diagnosis device comprising a processor configured to:

detect a parameter indicative of the vehicle being parked, the parameter being either: (1) an electrical current value that is equal to or smaller than a predetermined value for at least a first predetermined time; or (2) a lack of communication between the diagnosis device and a vehicle electronic control unit for at least a second predetermined time;

upon detecting the parameter indicative of the vehicle being parked, perform switch processing of switching one of the current cutoff devices to be diagnosed from an opened state to a closed state or from the closed state to the opened state or keeping closed the one of the current cutoff devices and switching closed or keeping closed another of the current cutoff devices while the parameter remains indicative of the vehicle being parked;

detect end-to-end voltage when current larger than a threshold flows through an end point A and an end point B after the switch processing, the current cutoff devices being connected to the end point A and the end point B in parallel, the threshold being set based on a peak value of cranking current that flows from the energy storage device to a starter at a start of an engine;

diagnose the one of the current cutoff devices based on the detected end-to-end voltage; and close both of the current cutoff devices while the vehicle is travelling after the detection of the end-to-end voltage in a case in which the one of the current cutoff devices being diagnosed is switched from the closed state to the opened state through the switch processing while the vehicle is parked.

2. The diagnosis device according to claim 1, wherein the end-to-end voltage of the current cutoff device is detected while the energy storage device is discharging.

3. The diagnosis device according to claim 1, wherein the end-to-end voltage of the current cutoff device is detected while the energy storage device is being charged.

4. The diagnosis device according to claim 1, wherein:
the diagnosis device sequentially determines open failure and close failure of each of a pair of current cutoff devices by executing processing (1) to (3):
(1) each time when an engine of the vehicle stops, one of the pair of current cutoff devices to be diagnosed is alternately switched from the opened state to the closed state or from the closed state to the opened state or the one of the current cutoff devices is kept closed, while the other of the pair of current cutoff devices is kept closed;
(2) the end-to-end voltage is detected when current larger than the threshold flows after the switching processing; and
(3) failure of the one of the pair of current cutoff devices is determined based on the detected end-to-end voltage.

5. The diagnosis device according to claim 4, wherein failure of the current cutoff device is determined by comparing the end-to-end voltage with a value detected in a previous iteration of the processing (2).

6. The diagnosis device according to claim 4, wherein failure of the current cutoff device is determined by comparing the end-to-end voltage with the end-to-end voltage of the current cutoff device detected in a non-diagnostic state.

7. The diagnosis device according to claim 1, wherein the processor is further configured to issue a warning upon determination of failure.

8. The diagnosis device according to claim 1, wherein the current cutoff devices are each a relay including a mechanical contact.

9. The diagnosis device according to claim 1, wherein the energy storage device is a lithium ion secondary battery.

10. The diagnosis device according to claim 1, wherein the vehicle is an idling stop vehicle.

11. An energy storage apparatus comprising:
an energy storage device;
the diagnosis device according to claim 1; and
a case housing the energy storage device and the diagnosis device.

12. A diagnosis method that diagnoses current cutoff devices connected in parallel and disposed on an energization path to an energy storage device mounted on a vehicle, the diagnosis method comprising the steps of:
detecting, via at least one sensor, a parameter indicative of the vehicle being parked, the parameter being either: (1) an electrical current value that is equal to or smaller than a predetermined value for at least a first predetermined time; or (2) a lack of communication between the diagnosis device and a vehicle electronic control unit for at least a second predetermined time;
upon detecting the parameter indicative of the vehicle being parked, performing, via a processor, switch processing of switching one of the current cutoff devices to be diagnosed from an opened state to a closed state or from the closed state to the opened state or keeping closed the one of the current cutoff devices and switching closed or keeping closed another of the current cutoff devices while the parameter remains indicative of the vehicle being parked;
detecting end-to-end voltage when current larger than a threshold flows through an end point A and an end point B after the switch processing, the current cutoff devices being connected to the end point A and the end point B in parallel, the threshold being set based on a peak value of cranking current that flows from the energy storage device to a starter at a start of an engine;
diagnosing the one of the current cutoff devices based on the detected end-to-end voltage; and
closing both of the current cutoff devices while the vehicle is travelling after the detection of the end-to-end voltage in a case in which the one of the current cutoff devices being diagnosed is switched from the closed state to the opened state through the switch processing while the vehicle is parked.

* * * * *